United States Patent [19]

Grossman et al.

[11] Patent Number: 5,367,655
[45] Date of Patent: Nov. 22, 1994

[54] MEMORY AND ASSOCIATED METHOD INCLUDING AN OPERATING MODE FOR SIMULTANEOUSLY SELECTING MULTIPLE ROWS OF CELLS

[75] Inventors: Anita S. Grossman; Paul A. Reed, both of Austin, Tex.

[73] Assignee: Motorola, Inc., Schaumburg, Ill.

[21] Appl. No.: 812,492

[22] Filed: Dec. 23, 1991

[51] Int. Cl.⁵ .................... G06F 12/00; G11C 11/413
[52] U.S. Cl. .......................... 395/425; 364/DIG. 1; 365/230.06; 365/238.5
[58] Field of Search ............... 395/425; 365/230.06, 365/238.5, 189.04, 230.03

[56] References Cited

U.S. PATENT DOCUMENTS

| | | | |
|---|---|---|---|
| 4,079,462 | 3/1978 | Koo | 365/238.5 |
| 4,099,253 | 7/1978 | Dooley, Jr. | 395/425 |
| 4,301,535 | 11/1981 | McKenny et al. | 371/21.4 |
| 4,408,306 | 10/1983 | Kuo | 365/238.5 |
| 4,489,404 | 12/1984 | Yasuoka | 365/238.5 |
| 4,561,072 | 12/1985 | Arakawa et al. | 365/238.5 |
| 4,651,304 | 3/1987 | Takata | 365/201 |
| 4,768,169 | 8/1988 | Perlegos | 365/238.5 |
| 4,954,994 | 9/1990 | Hashimoto | 365/230.06 |
| 4,965,770 | 10/1990 | Yanagisawa | 365/238.5 |
| 4,975,882 | 12/1990 | Kuo et al. | 365/200 |

FOREIGN PATENT DOCUMENTS

| | | |
|---|---|---|
| 0140698 | 10/1984 | European Pat. Off. |
| 0259967 | 7/1987 | European Pat. Off. |
| 58-56296 | 4/1983 | Japan |
| 60-179983 | 9/1985 | Japan |

OTHER PUBLICATIONS

McAdams et al., "A 1-Mbit CMOS Dynamic RAM With Design-For Test Functions", IEEE Journal of Solid State Circuits, Oct. 1986, vol. SC-21, No. 5, pp. 635-642.

Primary Examiner—Glenn Gossage
Attorney, Agent, or Firm—Susan C. Hill

[57] ABSTRACT

A memory (10) that has a shorter access time and higher reliability in a special mode of operation. In one form, the memory (10) has a special mode of operation in which multiple memory rows are simultaneously selected. As a consequence, multiple memory cells (44) are used to drive each bit line pair. Using multiple memory cells (44) to drive each bit line pair allows the bit lines to be driven to the proper logic state in a shorter time. This speeds up accesses to memory (10). Using multiple memory cells (44) to drive each bit line pair also improves the reliability of memory (10). Because multiple memory cells (44) are used to drive the same bit line pair, a failure of one memory cell (44) still leaves one or more functioning memory cells (44) to drive the correct logic state on the bit line pair. The memory may be incorporated in a cache controller of a data processing system in which only a part of the memory is being used. The extra unneeded memory cells may be used to help drive the bit lines to allow the cache controller to execute operations more quickly.

19 Claims, 8 Drawing Sheets

| CONTROL | INPUTS | | OUTPUTS | | | | NUMBER OF ROWS SELECTED |
|---|---|---|---|---|---|---|---|
| | ROW ADDRESS "A" | ROW ADDRESS "B" | ROW 3 SELECT | ROW 2 SELECT | ROW 1 SELECT | ROW 0 SELECT | |
| NORMAL MODE OF OPERATION: 0 0 0 0 | 1 1 0 0 | 1 0 1 0 | 1 0 0 0 | 0 1 0 0 | 0 0 1 0 | 0 0 0 1 | 1 1 1 1 |
| SPECIAL MODE OF OPERATION: 1 1 1 1 | 1 1 0 0 | 1 0 1 0 | 1 0 0 0 | 0 1 0 0 | 1 0 1 0 | 0 1 0 1 | 2 2 1 1 |

| CONTROL | INPUTS | | OUTPUTS | | | | NUMBER OF ROWS SELECTED |
|---|---|---|---|---|---|---|---|
| | ROW ADDRESS "A" | ROW ADDRESS "B" | ROW 3 SELECT | ROW 2 SELECT | ROW 1 SELECT | ROW 0 SELECT | |
| NORMAL MODE OF OPERATION | 0<br>0<br>0<br>0 | 1<br>1<br>0<br>0 | 1<br>0<br>1<br>0 | 1<br>0<br>0<br>0 | 0<br>1<br>0<br>0 | 0<br>0<br>1<br>0 | 0<br>0<br>0<br>1 | 1<br>1<br>1<br>1 |
| SPECIAL MODE OF OPERATION | 1<br>1<br>1<br>1 | 1<br>1<br>0<br>0 | 1<br>0<br>1<br>0 | 1<br>0<br>0<br>0 | 1<br>1<br>0<br>0 | 1<br>0<br>1<br>0 | 1<br>1<br>1<br>1 | 4<br>2<br>2<br>1 |

MEMORY AND ASSOCIATED METHOD INCLUDING AN OPERATING MODE FOR SIMULTANEOUSLY SELECTING MULTIPLE ROWS OF CELLS

Field of the Invention

The present invention relates in general to data processing systems, and more particularly to a memory in a data processing system.

BACKGROUND OF THE INVENTION

Present day data processing systems which use a microprocessor and which are optimized for high speed operation often require a "ache". A cache is a block of memory that can be accessed very quickly by the microprocessor. Usually, a cache can be accessed more quickly than the main or system memory used in the data processing system. Because microprocessor systems make frequent accesses to memory, making accesses to cache instead of to system memory results in a significant savings of time.

Caches are generally used to store frequently used or recently used values, such as addresses, data, or instructions. A goal is to minimize the memory accesses that must use the slower system memory by maximizing the memory accesses that are able to use the cache instead. Because a large number of accesses are made to cache, it is important that the amount of time that is required to access the cache be reduced as much as possible in order to speed up the data processing system. Generally, the shorter the cache access time, the faster the execution speed of the data processing system. Therefore, reducing the time required to access a cache is an important goal of many high speed data processing systems.

Many microprocessor systems also utilize a cache controller as well as a cache. A cache controller is a device that coordinates each access to the cache. Therefore part of the time required for each cache access is the time required for the cache controller to perform its function. Cache controllers also contain memory within their internal circuitry. The faster it is to access the memory within the cache controller, the faster the cache controller itself can operate and the faster the data processing system can execute instructions.

Each memory cell within a memory, including a cache controller memory, is capable of storing a digital value representing either a logical state "0" or a logical state "1". Memory cells are then combined to form memory entries. A memory entry is made up of one or more memory cells and corresponds to the width of the memory. An "8K by 8" memory has 8K total memory entries and each memory entry consists of eight memory cells or bits. An "8K by 1" memory still has 8K total memory entries, but each memory entry consists of only one memory cell or bit. Note that "K" is equal to 1024.

Prior art memories, including cache controller memories, use a memory cell array arranged in a grid array of rows and columns. The width of each column is the same as the width of the memory's data entries, and can be one or more bits wide. For example, a "4K by 4" memory has memory entries that are four bits wide, that is, each memory entry contains four memory cells. Thus, each column in a "4K by 4" memory is four bits wide. And similarly, a "4K by 1" memory has memory entries that are only one bit wide, that is, each memory entry contains only one memory cell. Thus, each column in a "4K by 1" memory is one bit wide. Additionally, the width of the memory's data path is often the same as the width of the memory's data entries.

A standard Static Random Access Memory (SRAM) cell has two bit lines which are used to transfer data in and out of the memory cell. In prior art memories, only one memory cell at a time transferred its data contents onto the bit lines. Thus in prior art memories, only one memory entry at a time was accessed, and this access was accomplished by selecting one row and one column. The one memory entry that was located in both the selected row and the selected column was used to drive one pair of bit lines for each memory cell in the memory entry. Because each memory cell in the selected memory entry was coupled to a different pair of bit lines, the bit lines were only ever driven by one selected memory cell at a time. The faster each selected memory cell drives its pair of bit lines to the required voltage, the faster the speed of the memory.

In order to increase the speed of the memory by driving the bit lines more quickly, prior art memories increased the size of the devices within each memory cell that were used to drive the bit lines. But unfortunately, increasing the size of the drive devices increased the size of the memory cells and, thus, the amount of semiconductor area required to build each cell. Thus, prior art memories were faced with a direct trade-off between the size of each memory cell and the access speed of the memory.

SUMMARY OF THE INVENTION

The previously mentioned needs are fulfilled and other advantages achieved with the present invention. In one form, the present invention comprises an apparatus and a method for accessing a memory having a plurality of memory cells arranged in a predetermined number of rows and a predetermined number of columns. The memory also has a control means for providing a control signal for determining whether one or a plurality of the predetermined number of rows are to be selected. Additionally, the memory has a first logic means coupled to a plurality of the predetermined number of rows and receiving the control signal, for selecting a mode of read operation in which a plurality of rows are selected when one column is selected.

The present invention will be understood by one skilled in the art from the detailed description below in conjunction with the accompanying drawings.

DESCRIPTION OF THE PREFERRED EMBODIMENT

The terms "assert" and "negate" will be used when referring to the rendering of a signal or similar apparatus into its logically true or logically false state, respectively. The asterisk symbol will be used to indicate a complemented signal. For example, SIGNAL* indicates a signal that is the complementary logic state of SIGNAL.

Figure 1A:
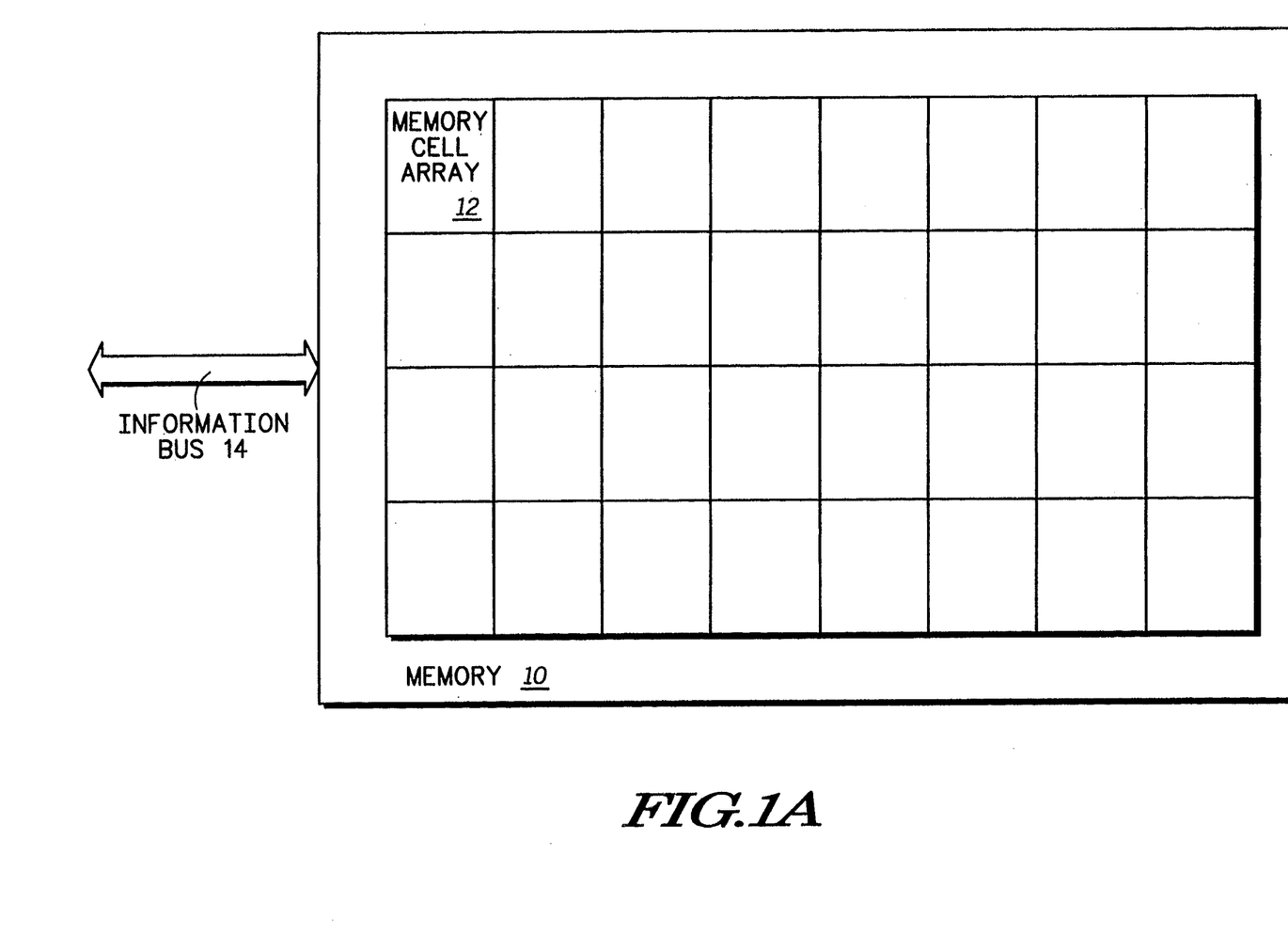
FIG. 1A illustrates, in block diagram form, a memory in accordance with one embodiment of the present invention.

Unlike prior art memories, a memory 10 in FIG. 1A allows multiple rows to be simultaneously selected in a memory cell array 12. This results in multiple memory cells in multiple rows being used to drive the same bit line pair. Because more memory cells are driving the same bit line pair, that bit line pair can be driven to the proper logic state in a shorter time. This allows the access time of the memory cell array 12 to be reduced. And consequently, reducing the access time of memory cell array 12 allows a data processing system using memory cell array 12 to execute operations more quickly.

In addition, using multiple memory cells to drive the same bit line pair increases reliability. In prior art memories, a failure of any one memory cell could result in the bit line pair being driven with an incorrect data value when the faulty memory cell was selected. But in the present invention, multiple memory cells can be used to drive the same bit line pair. So a failure of one memory cell still leaves one or more functioning memory cells to drive the correct data value on the bit line pair. A prior art memory without redundancy is rendered useless by the failure of even one memory cell; whereas, a memory utilizing the present invention can continue to function with possibly one or more failed memory cells.

Some users of cache controllers only need to use a fraction of the available memory in the cache controller. The present invention allows those users to take advantage of the unneeded memory to increase the speed of the cache controller. By using the unneeded memory cells to help drive the bit lines, the access time of the cache can be improved.

Using the present invention, a manufacturer is able to produce only one memory device, or one cache controller device utilizing that memory device, which is able to satisfy the requirements of many customers. If a customer needs to use all of the available memory space, the customer merely operates the memory in a normal mode of operation in which the memory functions like a prior art memory.

However, if the customer does not need to use all of the available memory space, the customer may operate the memory in a special mode of operation in which the unneeded memory cells are used to help drive the bit lines more quickly in order to increase the speed of the memory. Thus, the manufacturer can produce one memory device and yet still allow different users to select their own tradeoff between the memory space used and the speed of the memory. Producing one device to satisfy the needs of many customers results in a considerable savings.

Figure 1B:
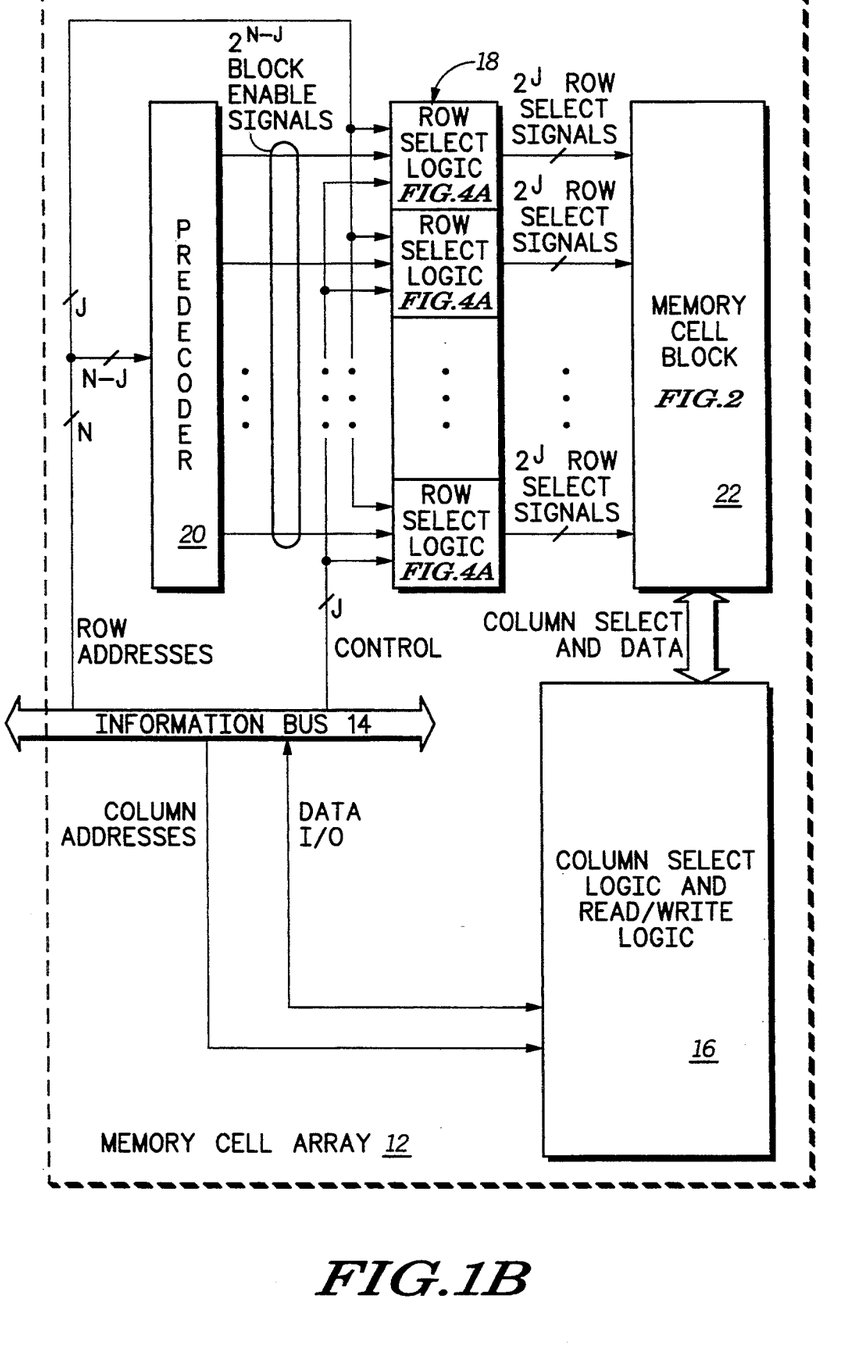
FIG. 1B illustrates, in block diagram form, a memory cell array of FIG. 1A in accordance with one embodiment of the present invention.

FIG. 1A illustrates a memory 10. In the illustrated embodiment of the present invention, memory 10 is organized in a 16K by 17 configuration. Other embodiments could use a different configuration of memory 10. In the embodiment illustrated in FIG. 1A, memory 10 is organizationally divided into thirty-two identical memory cell arrays 12, of which one memory cell array 12 is shown in FIG. 1B. In other embodiments of the present invention, any number of memory cell arrays 12 could have been used. Additional addresses (not shown) and standard decode logic (not shown) are needed in order to select only one of the thirty-two memory cell arrays 12 at a time. In addition, FIG. 1A includes an information bus 14 which transmits address and control information in, and possibly data, and out of memory 10.

FIG. 1B illustrates the memory cell array 12 of FIG. 1A in more detail. In FIG. 1B, information bus 14 transmits address and control information, and possibly data, in and out of memory 10. Information bus 14 sends column addresses to a column select logic and read/write logic block 16. In one embodiment, information bus 14 also sends and receives data from column select logic and read/write logic block 16 across one or more data I/O conductors—therefor. Often the width of the memory's data path, including the data I/O path, is the same as the width of the memory's data entries. Column select logic and read/write logic block 16 generates column select signals which are then input to memory cell array 12 in order to select a desired column. Column select logic and read/write logic block 16 also handles the flow of data into and out of memory cell array 12.

The number "N" is determined by the number of rows in memory cell array 12. The number of rows in memory cell array 12 is equal to $2^N$. For example, if memory cell array 12 has one hundred twenty-eight rows, or $2^7$ rows, then N=7. The number "J" is determined by the number of row select signals generated by each row select logic circuit 18. Each row select logic circuit 18 generates $2^J$ row select signals. For example, if each row select logic circuit 18 generates four, or $2^2$ row select signals, then J=2. A predecoder 20 is an (N-J):($2^{N-J}$) decoder. Predecoder 20 receives N-J row addresses from information bus 14 and decodes these N-J row addresses to generate $2^{N-J}$ block enable signals. For example, if N=7 and J=2, predecoder 20 is a 5:32 decoder.

Row select logic circuit 18, unlike row select circuitry in standard memories, allows multiple rows to be simultaneously selected in memory cell array 12. There are a total of $2^{N-J}$ row select logic circuits 18. Each row select logic circuit 18 receives "J" row addresses and "J" control signals from information bus 14. Note, however, that some embodiments of the present invention may choose to transfer only one control signal, rather than "J" control signals, from the information bus 14. Each row select logic circuit 18 also receives $2^{N-J}$ block enable signals from predecoder 20. Each row select logic circuit 18 uses these three sets of inputs to generate $2^J$ row select signals which are inputs to memory cell array 12.

In operation, the internal functioning of memory cell array 12 in FIG. 1B is the same as the internal functioning of most standard memories, with a few significant differences. The primary difference is that each row select logic circuit 18 in memory 10 is capable of selecting multiple rows in memory cell array 12. As a result, multiple memory cells in memory cell array 12 can be selected to simultaneously drive the same bit lines. Another difference is that information bus 14 supplies one or more control signals to the row select logic circuits 18. The predecoder 20 and the column select logic and read/write logic 16 function the same as comparable logic in most standard memories.

In a standard memory, the column addresses are decoded to select one column, and the row addresses are decoded to select one row. In memory 10, the column addresses are likewise decoded to select one column, but the row addresses are decoded in such a way that more than one row can be selected at a time. Using one or more control signals input to row select logic circuits 18, a user of the memory 10 can select whether to have memory 10 operate as a standard memory which selects only one row at a time, or to have memory 10 operate in a special mode in which multiple rows are selected at a time. Selecting multiple rows at a time allows several memory cells to drive the same bit lines producing a faster and more reliable memory 10.

FIG. 1B also illustrates a predecoder 20 which is implemented, in this example, as a 5:32 decoder with five row address inputs and thirty-two block enable signal outputs. Each of the thirty-two row select logic circuits 18 receives one of the thirty-two block enable signals. Predecoder 20 only asserts the block enable signal for one of the thirty-two available row select logic circuits 18 at a time. Alternate embodiments of memory 10 may not duplicate predecoder 20 for every memory cell array 12. Instead, alternate embodiments of memory 10 may share predecoder 20 circuitry between multiple memory cell arrays 12.

Figure 2:
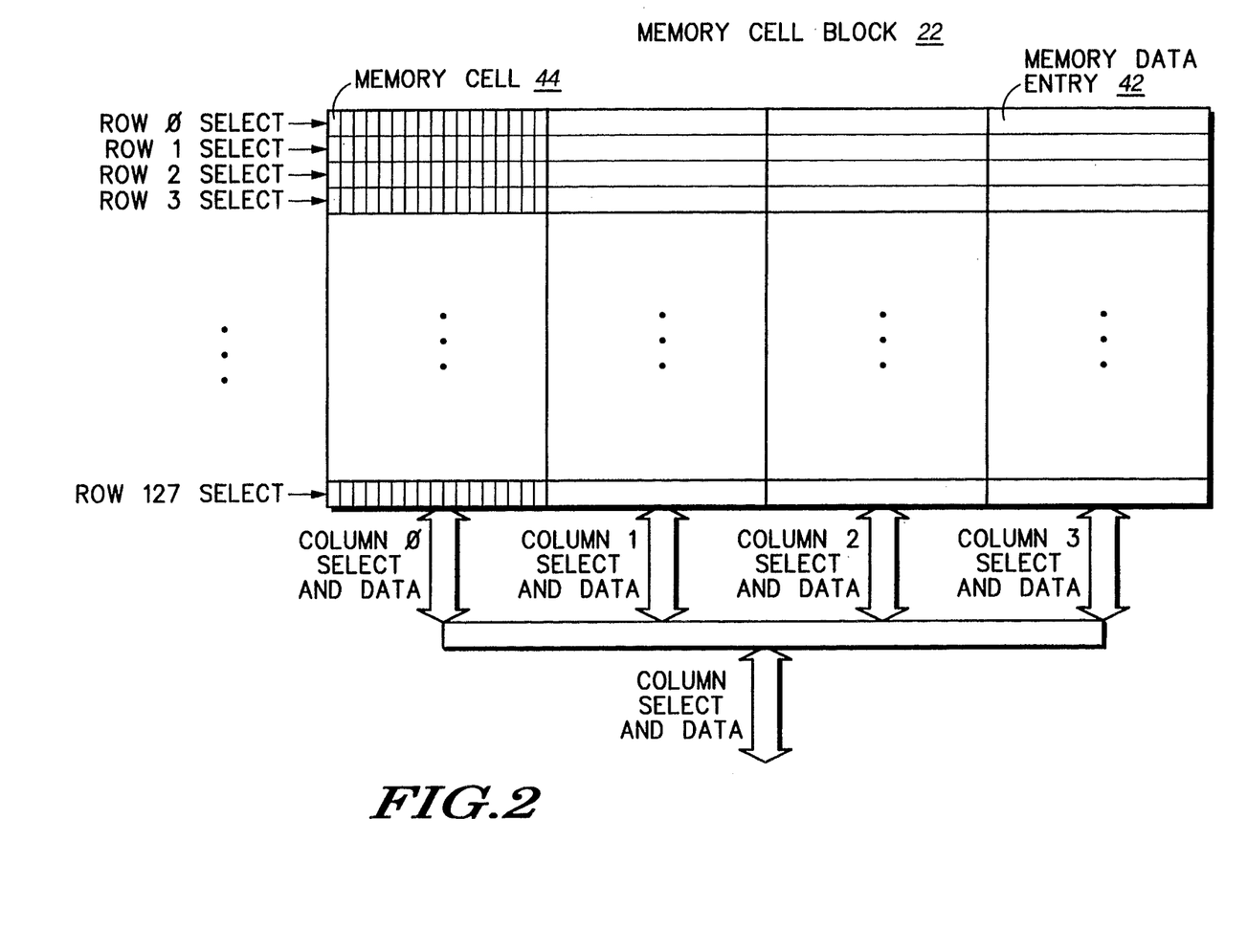
FIG. 2 illustrates, in block diagram form, a memory cell block of FIG. 1B in accordance with one embodiment of the present invention.

FIG. 2 illustrates how each of the identical thirty-two memory cell blocks 22 is arranged in a grid of rows and columns. There are one hundred twenty-eight rows and four columns in each memory cell block, although a different number of rows and columns could have been used. Each data entry 42 can be individually selected by asserting one row select signal and one column select signal. This is the normal mode of operation for most memories. In addition, the present invention permits a special mode of operation in which multiple data entries 42 are selected by asserting multiple row select signals and one column select signal.

Each memory data entry 42 is seventeen bits wide. In other words, each memory data entry 42 contains seventeen memory cells identical to memory cell storage circuit 44. Again, any number of memory cells 44 could be used in each memory data entry 42. Memory cell 44 in the disclosed embodiment is a Static Random Access Memory (SRAM) cell. However, other types of memory cells, such as read only memory cells, could be used in the present invention.

In order for any data entry 42 to be selected, both its row select signal and its column select signal must be asserted. Just asserting solely its row select signal or solely its column select signal does not select data entry 42. There is one row select signal for each row and one column select signal for each column. Each memory cell block receives the same one hundred twenty-eight row select signals as inputs. Row 0 select signal is an input to all of the data entries 42 in row 0, row 1 select signal is an input to all of the data entries 42 in row 1, and so on all the way up to row 127 select signal which is an input to all of the data entries 42 in row 127.

Each memory cell block 22 receives the same four column select signals as inputs. Column 0 select signal is an input to all of the data entries 42 in column 0, column 1 select signal is an input to all of the data entries 42 in column 1, column 2 select signal is an input to all of the data entries 42 in column 2, and column 3 select signal is an input to all of the data entries 42 in column 3. In addition, all of the memory cells 44 within each memory cell block 22 have the ability to receive and transmit data.

In most standard memories, only one column and one row is selected at a time. This results in only one memory data entry 42 being selected at a time. The present invention, however, can select one column and multiple rows at a time. This results in more than one memory data entry 42 being selected at a time. The multiple selected memory data entries 42 are thus all written simultaneously during a single access to memory. And likewise, the multiple selected memory data entries 42 are all read simultaneously during a subsequent single access to memory. Simultaneously reading from multiple memory data entries 42 which store the same data value allows several memory cells to drive the same bit lines producing a faster and more reliable memory 10.

Figure 3:
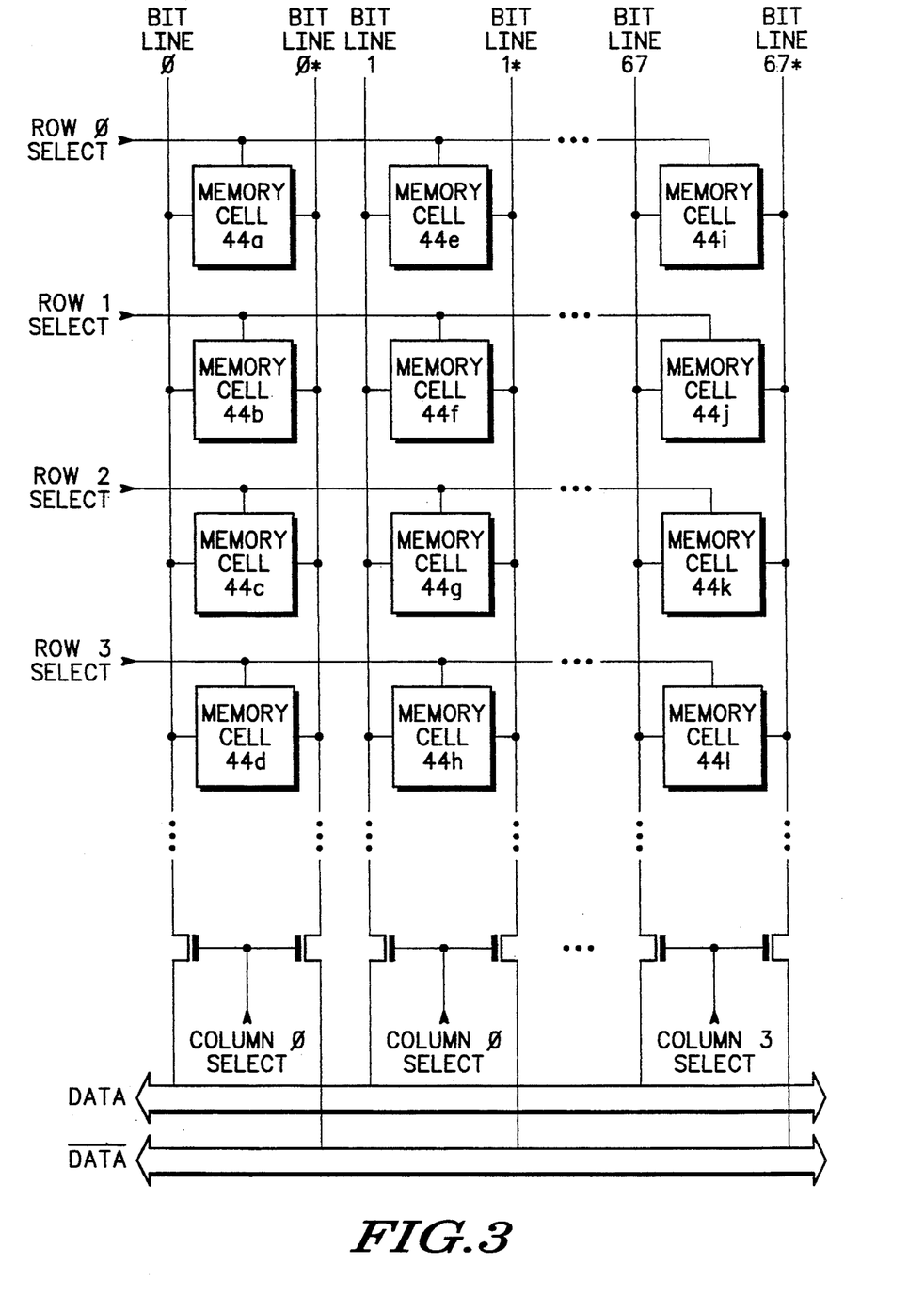
FIG. 3 illustrates, in partial block diagram form, a portion of the memory cell block of FIG. 2.

FIG. 3 illustrates a portion of memory cell block 22 of FIG. 2. FIG. 3 illustrates how selecting multiple rows and one column can result in multiple memory cells 44 driving the same bit line pair. Each memory cell 44 receives and transmits data across a pair of bit lines. The logical state of one bit line of the bit line pair is always the complement of the logical state of the other bit line. A memory cell 44 is read by sensing the voltage differential between the two bit lines of a bit line pair. Whether the memory cell 44 is storing a logic "0" or a logic "1" is determined by which bit line of the bit line pair is at the higher voltage. A larger voltage differential can be created more quickly if multiple memory cells 44 with the same logic value are driving the same bit line pair.

Memory cells 44a, 44b, 44c, and 44d all receive and transmit data values to a data path across the same bit lines BL0 (bit line O) and BL0*. Memory cells 44e, 44f, 44g, and 44h all receive and transmit data values to the data path across the same bit lines BL1 and BL1*. And memory cells 44i, 44j, 44k, and 44l all receive and transmit data values to the data path bus across the same bit lines BL67 and BL67*. In the normal mode of operation, only one memory cell 44 is selected and used to drive each bit line pair. But in a special mode of operation, multiple memory cells 44 are selected and used to drive each bit line pair. Using multiple memory cells 44 to drive each bit line pair creates a larger voltage differential more quickly on the bit lines, and thus allows memory 10 to be accessed more quickly.

Referring to both FIG. 2 and FIG. 3, the memory data entries 42 in FIG. 3 can be accessed one at a time, which is the way most standard memories are accessed. As an example of a standard memory read, if row 0 select and column 0 select are both asserted, then the seventeen bit memory data entry 42 containing memory cells 44a and 44e is the only memory data entry selected. Memory cell 44a is the only selected memory cell to drive bit lines BL0 and BL0* and memory cell 44e is the only selected memory cell to drive bit lines BL1 and BL1*.

Unlike standard memories, the present invention allows multiple memory data entries 42 to be selected so that multiple memory cells 44 simultaneously drive the same bit line pair. For example, if row 0 select, row 2 select, and column 0 select are all asserted, then the two seventeen bit memory data entries 42 containing memory cells 44a and 44e, and 44c and 44g, respectively, are both selected. Both memory cells 44a and 44c are selected to drive bit lines BL0 and BL0*, and both memory cells 44e and 44g are selected to drive bit lines BL1 and BL1*. With multiple memory cells 44 driving each bit line pair, a larger voltage differential is created more quickly on the bit lines, the logic value stored in the memory cells 44 can thus be determined more quickly, and as a result memory 10 can be accessed more quickly.

Figure 4A:
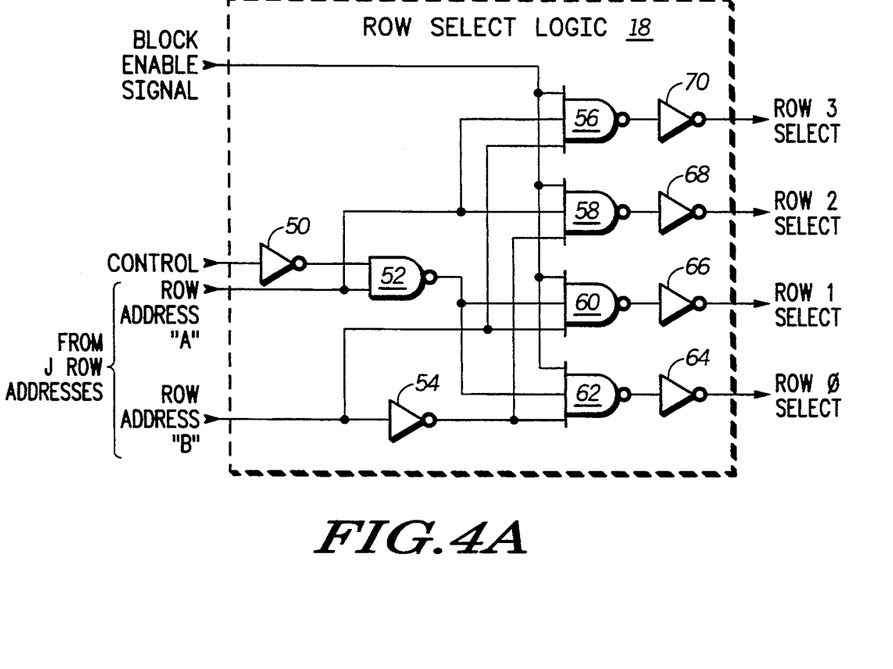
FIG. 4A illustrates, in logic diagram form, one possible row select logic circuit of FIG. 1B in accordance with one embodiment of the present invention.

FIG. 4A illustrates one possible implementation of the row select logic circuit 18 of FIG. 1B. A control signal is the input to an inverter 50. The output of inverter 50 and row address "A" are inputs to a NAND gate 52. Row address "B" is the input to an inverter 54. A block enable signal, row address "A", and row address "B" are all inputs to a NAND gate 56. The block enable signal, row address "A", and the output of inverter 54 are all inputs to a NAND gate 58. The block enable signal, the output of NAND gate 52, and row address "B" are all inputs to a NAND gate 60. The block enable signal, the output of NAND gate 52, and the output of inverter 54 are all inputs to a NAND gate 62.

The output of NAND gate 62 is the input to an inverter 64, and the output of inverter 64 is a row 0 select signal. The output of NAND gate 60 is the input to an inverter 66, and the output of inverter 66 is a row 1 select signal. The output of NAND gate 58 is the input to an inverter 68, and the output of inverter 68 is a row 2 select signal. The output of NAND gate 56 is the input to an inverter 70, and the output of inverter 70 is a row 3 select signal.

Figure 4B:
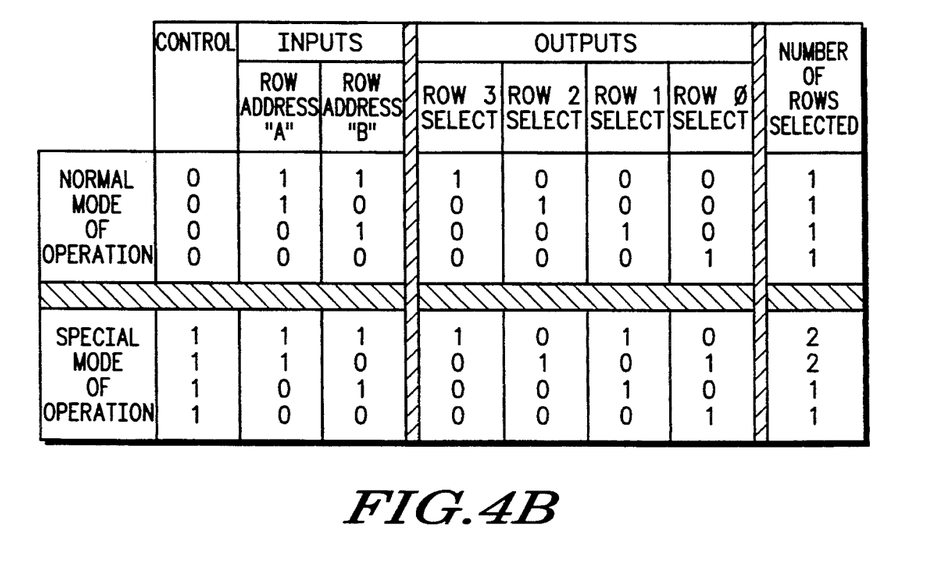
FIG. 4B illustrates, in truth table form, the inputs and outputs of the row select logic circuit of FIG. 4A in accordance with one embodiment of the present invention.

FIG. 4B illustrates a truth table of the circuit in FIG. 4A. When the control input is a logic "0", the circuit operates in a normal mode of operation in which only one row select signal is asserted at a time. However, when the control input is a logic "1", the circuit operates in a special mode of operation in which more than one row select signal can be asserted at a time. In the present embodiment, row address "A" will always be a logic "1 in the special mode of operation. Thus, two row select signals will always be simultaneously asserted in the special mode of operation.

Figure 5A:
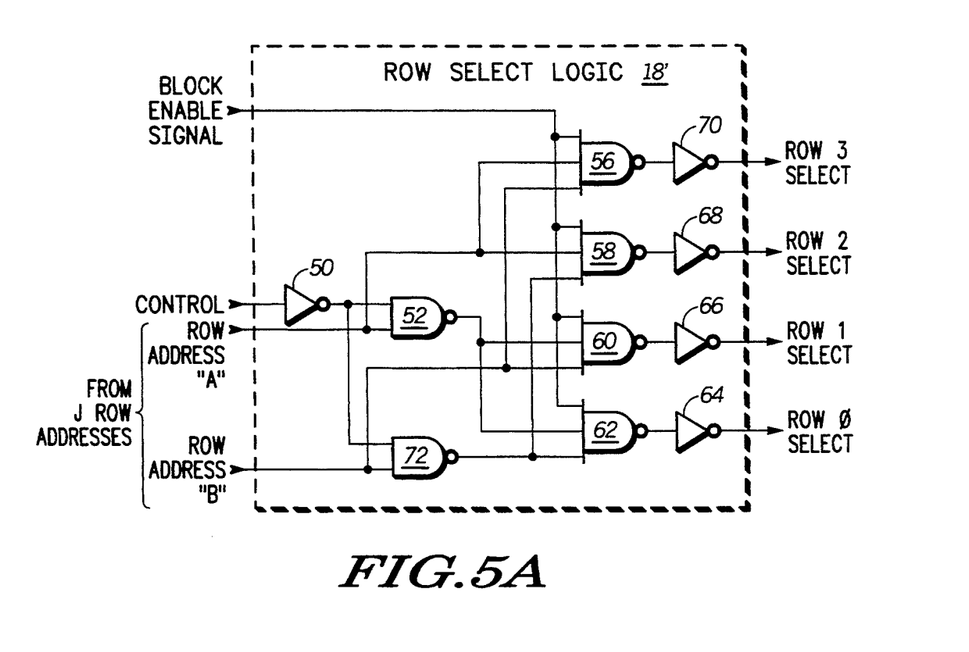
FIG. 5A illustrates, in logic diagram form, a second possible row select logic circuit of FIG. 1B in accordance with one embodiment of the present invention.

FIG. 5A illustrates row select logic circuit 18' which is a modification of row select logic circuit 18 of FIG. 4A. Row select logic circuit 18' could be used in place of row select logic circuit 18 in FIG. 1B. For convenience of comparison, the identical elements have been labeled the same. Row select logic circuit 18' uses a NAND gate 72 instead of inverter 54. NAND gate 72 has row address "B" and the output of inverter 50 as inputs. Also, NAND gate 58 and NAND gate 62 do not have the output of inverter 54 as an input, but instead have the output of NAND gate 72 as an input.

Figure 5B:
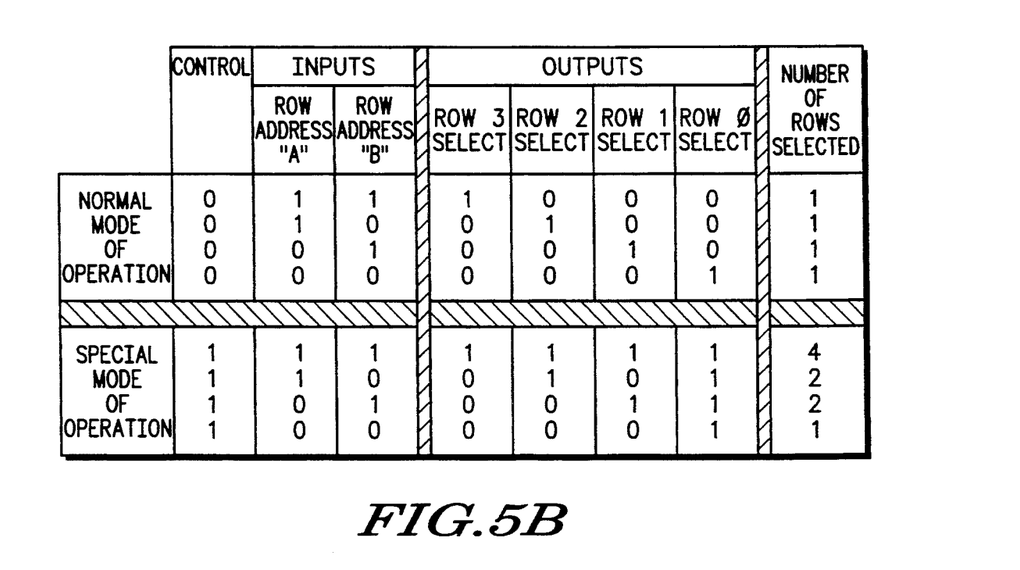
FIG. 5B illustrates, in truth table form, the inputs and outputs of the row select logic circuit of FIG. 5A in accordance with one embodiment of the present invention.

FIG. 5B illustrates a truth table of the circuit in FIG. 5A. When the control input is a logic "0", the circuit operates in a normal mode of operation in which only one row select signal is asserted at a time. However, when the control input is a logic "1", the circuit operates in a special mode of operation in which more than one row select signal can be asserted at a time.

In one embodiment of row select logic circuit 18', both row address "A" and row address "B" could always be forced by hardware or software to be a logic "1" in the special mode of operation. Thus, in this embodiment, four row select signals would always be simultaneously asserted in the special mode of operation. In an alternate embodiment, a second control signal could be used to choose between selecting two rows or selecting four rows in the special mode of operation. When the "four row" option was chosen, both row address "A" and row address "B" would be forced by hardware or software to be a logic "1". And when the "two row" option was chosen, only one, but not both, row addresses would be forced by hardware or software to be a logic "1".

The row select logic circuit 18 of FIG. 4A and the row select logic circuit 18' of FIG. 5A both have two row addresses as inputs and four row select signals as outputs. The circuits 18 and 18' both function like a 2:4 decoder which can only assert one output in the normal mode of operation, but which can assert multiple outputs in the special mode of operation. It would be possible to extend the present embodiment of the invention so that more than four memory rows could be simultaneously accessed.

In alternate embodiments of the present invention, it would be possible to extend circuits 18 and 18' to have more inputs and more outputs. For example, circuits 18 and 18' could be extended to function like a 3:8 decoder, or even an $X:2^X$ decoder having X row address inputs and $2^X$ row select outputs. If circuit 18 operated as an $X:2^X$ decoder and was in the special operating mode, circuit 18 could simultaneously assert any number of row select outputs that was a power of two, up to a maximum of half of its $2^X$ outputs. Likewise, if circuit 18' operated as an $X:2^X$ decoder and was in the special operating mode, circuit 18' could simultaneously assert any number of row select outputs that was a power of two, up to a maximum of all of its $2^X$ outputs.

Figure 6:
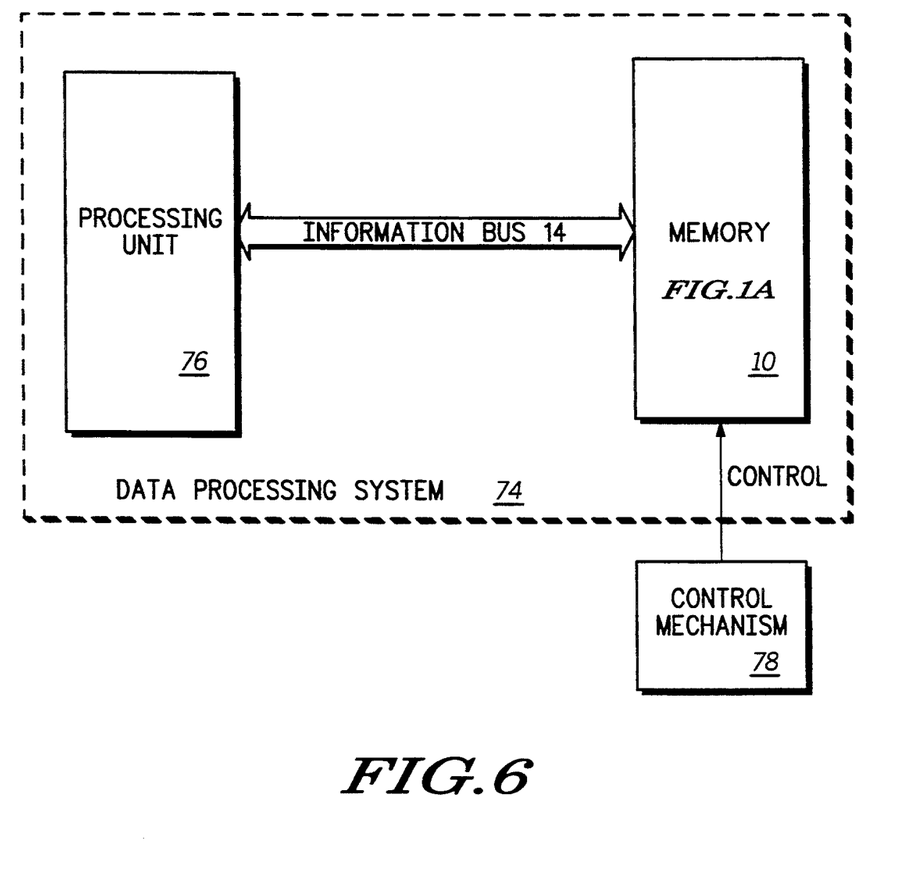
FIG. 6 illustrates, in block diagram form, a data processing system in accordance with one embodiment of the present invention.

FIG. 6 illustrates one form of the present invention. Data processing system 74 includes the memory 10 of FIG. 1A. A processing unit 76 accesses the memory 10 across information bus 14. A control mechanism 78 transmits a control signal to memory 10. Memory 10 uses the control signal to determine whether memory 10 is in normal operating mode and thus should select only one row of memory at a time, or whether memory 10 is in special operating mode and thus should select multiple rows of memory at a time.

The control mechanism 78 can be either external to the data processing system 74, as is illustrated, or it can alternatively be part of the data processing system 74. For example, processing unit 76, memory 10, and control mechanism 78 could all be contained on the same semiconductor chip, and control mechanism 78 could be a control register bit which is programmable by the user. Alternatively, control mechanism 78 could be an external device that transmits a control signal to the data processing system 74.

In one embodiment, the data processing system 74 could receive the control signal at an external pin and the control mechanism 78 could be the electrical connection which places either a high or low logic level on the pin. If only the normal mode of operation was required, the pin could be hardwired to a logic "0". And if only the special mode of operation was required, the pin could be hardwired to a logic "1".

Alternatively, the control mechanism 78 supplying the control signal could be a control register bit that was writable by the processing unit 76. This would allow the user to selectively determine, using software, whether to place memory 10 into its normal mode of operation or into its special mode of operation.

Figure 7:
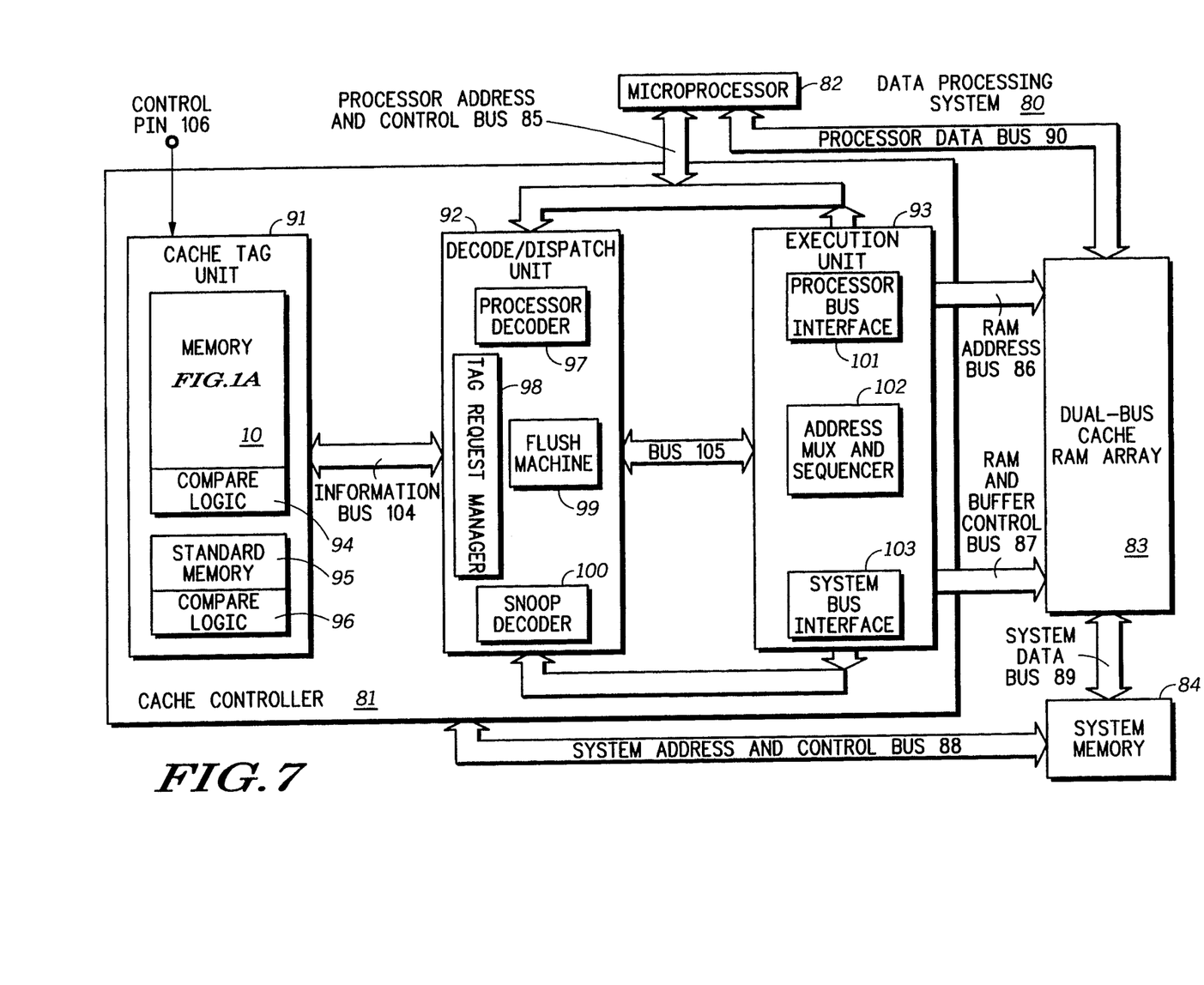
FIG. 7 illustrates, in block diagram form, a data processing system having a cache controller in accordance with one embodiment of the present invention.

FIG. 7 illustrates another form of the present invention. Data processing system 80 includes a cache controller 81, a microprocessor 82, a dual-bus cache Random Access Memory (RAM) array 83, and a system memory 84. The cache controller 81 communicates with the microprocessor 82 across a processor address and control bus 85. The cache controller 81 communicates with the dual-bus cache RAM array 83 across a RAM address bus 86 and a RAM and buffer control bus 87. The cache controller 81 communicates with system memory 84 across a system address and control bus 88. The dual-bus cache RAM array 83 communicates with the system memory 84 across a system data bus 89. And the dual-bus cache RAM array 83 communicates with the microprocessor 82 across a processor data bus 90.

Within the cache controller 81 is a cache tag unit 91, a decode/dispatch unit 92, and an execution unit 93. The cache tag unit 91 contains the memory 10 of FIG. 1A, compare logic 94, a standard memory 95, and compare logic 96. The decode/dispatch unit 92 contains a processor decoder 97, a tag request manager 98, a flush machine 99, and a snoop decoder 100. The execution unit 93 contains a processor bus interface 101, an address multiplexer (MUX) and sequencer 102, and a system bus interface 103. The cache tag unit 91 communicates with the decode/dispatch unit 92 across an information bus 104. The decode/dispatch unit 92 communicates with the execution unit 93 across a bus 105.

Control pin 106 receives an input signal to cache controller 81 which is either a high or low logic level. If control pin 106 receives a logic level "0", memory 10 operates in its normal mode of operation. And if control pin 106 receives a logic level "1", memory 10 operates in its special mode of operation. The mode in which memory 10 is operating can be changed by changing the logic level received by control pin 106. If only the normal mode of operation is required for memory 10, control pin 106 could be hardwired to a logic "0". And if only the special mode of operation was required for memory 10, then control pin 106 could be hardwired to a logic "1".

In operation, cache controller 81 operates as a standard cache controller. Cache controller 81 receives address and control information and uses that information to control accesses to the dual-bus cache RAM array 83. In some data processing systems 80, only part of the memory 10 in the cache controller 81 is required. For example, some data processing systems 80 require the use of all of memory 10. Some other data processing systems 80 only require the use of one half of memory 10. While still other data processing systems 80 only require the use of one quarter of memory 10.

For those data processing systems 80 which do not require the use of all of memory 10, the present invention allows the extra unneeded memory data entries 42 to be used to help drive the bit lines. Driving each bit line with multiple memory cells 44 allows the memory 10 to be accessed more quickly. And accessing memory 10 more quickly allows the cache controller 81 to execute operations more quickly. And as a result, the speed and performance of the data processing system 80 can be improved.

For those data processing systems 80 which only require the use of one half of memory 10, the present invention allows the remaining unneeded half of memory 10 to be used to help drive the bit lines. Each read access and each write access to memory 10 can be controlled to select two rows of memory cells 44. Consequently, two memory cells 44 in two different memory rows can be used to drive each pair of bit lines. Instead of being wasted, the unneeded memory cells 44 can be used to speed up the operation of the memory 10 and thus improve the performance of the cache controller 81.

For those data processing systems 80 which only require the use of one quarter of memory 10, the present invention allows the remaining unneeded three quarters of memory 10 to be used to help drive the bit lines. Each read access and each write access to memory 10 can be controlled to select four rows of memory cells 44. Consequently, four memory cells 44 in four different memory rows can be used to drive each pair of bit lines. Instead of being wasted, the unneeded memory cells 44 can be used to speed up the operation of the memory 10 and thus improve the performance of the cache controller 81.

In summation, the above specification describes a memory 10 with faster access time and higher reliability. The faster access time and higher reliability is achieved by selecting multiple memory rows and thus using multiple memory cells 44 to drive each pair of bit lines. The above specification also describes a cache controller 81 and a data processing system 74 which have improved performance due to the fact that they each contain a memory 10 which has faster access time and higher reliability.

While the present invention has been illustrated and described with reference to specific embodiments, further modifications and improvements will occur to those skilled in the art. For example, memory 10 may be part of a data processing system 74, may be part of a cache controller 81, or may stand alone. Memory 10 could be divided into any number of memory cell blocks 22, and each memory cell block 22 could be arranged in any number of rows and columns. Any number of memory cells 44 could be contained within each memory data entry 42. Row select logic circuits 18 and 18' could each be extended to function as an $X:2^X$ decoder having X inputs and $2^X$ outputs in order to allow more memory cells 44 to drive each bit line pair.

Processing unit 76 and memory 10 may or may not be contained on a single semiconductor chip. Likewise, data processing system 74 and control mechanism 78 may or may not be contained on a single semiconductor chip. Memory 10 may receive the control information which selects between normal and special operating modes from a source contained on the same semiconductor chip, or from an external source which is not on the memory's semiconductor chip. The special operating mode of memory 10 may be used as the exclusive operating mode of memory 10, may be used only during testing, or may be used at selected times with the normal operating mode being used at all other times.

Information bus 14 may contain a serial or parallel address bus. If the address bus is serial, it may consist of only one address signal. Likewise, information bus 14 may contain a serial or parallel data bus. If the data bus is serial, it may consist of only one data signal. Also, if memory 10 is a "by 1" memory, the data bus may consist of only one data signal.

It is to be understood, therefore, that this invention is not limited to the particular forms illustrated and that the appended claims cover all modifications that do not depart from the spirit and scope of this invention.

We claim:

1. A memory circuit, comprising:
    a control conductor for transferring a control signal;
    a plurality of memory cells, including a first memory cell located in a first row and a first column, and including a second memory cell located in a second row and the first column;
    a bit line; and
    select logic means for receiving the control signal, and in response to the control signal having a first logic state, said select logic means coupling the first memory cell to said bit line so that the memory circuit is accessed in a first access time, and in response to the control signal having a second logic state, said select logic means coupling both the first memory cell and the second memory cell to said bit line so that the memory circuit is accessed in a second access time, the second access time being of shorter duration than the first access time, said select logic means being coupled to said control conductor and to said plurality of memory cells
    wherein said plurality of memory cells is a plurality of static random access memory (SRAM) cells.

2. A memory circuit as in claim 1, further comprising:
    a data bus coupled to said bit line.

3. A memory circuit as in claim 1, further comprising:
    column select logic, coupled to said plurality of memory cells;
    a plurality of address conductors, coupled to said column select logic; and
    cache control circuitry, coupled to said plurality of address conductors.

4. A memory circuit as in claim 1, wherein the memory circuit further comprises:
    an address bus for receiving a plurality of address signals from external to the memory circuit, said address bus being coupled to said select logic means; and
    wherein said select logic means receives a portion of the plurality of address signals.

5. A memory circuit as in claim 4, wherein said plurality of memory cells further includes:
    a third memory cell located in a third row and the first column; and
    a fourth memory cell located in a fourth row and the first column; and
    wherein in response to the control signal having the second logic state and the portion of the plurality of address signals having a predetermined value, said select logic means couples the first, second, third, and fourth memory cells to said bit line so that the memory circuit is accessed in a third access time, the third access time being of shorter duration than the second access time.

6. A memory circuit as in claim 1, further comprising:
    control means for providing the control signal to said control conductor, said control means being coupled to said control conductor.

7. A memory circuit as in claim 6, wherein said control means comprises:
    a user programmable register circuit.

8. A memory circuit as in claim 6, wherein said control means comprises:
    an integrated circuit pin.

9. A method for operating a memory, the memory being a static random access memory (SRAM), the memory having a plurality of memory cells arranged in a plurality of rows and a plurality of columns, the method comprising the steps of:
    selecting one of a slower operating mode and a faster operating mode, the slower operating mode having a first memory access time and the faster operating mode having a second memory access time, the second memory access time having a shorter time duration than the first memory access time;
    receiving an address;
    if the slower operating mode is selected, selecting a first one of the plurality of rows and one of the plurality of columns corresponding to the address;
    if the slower operating mode is selected, accessing the memory with the first memory access time to retrieve a stored information value;
    if the faster operating mode is selected, selecting the first one of the plurality of rows, a second one of the plurality of rows, and the one of the plurality of columns corresponding to the address; and
    if the faster operating mode is selected, accessing the memory with a second memory access time to retrieve the stored information value.

10. A method as in claim 9, further comprising the steps of:
    if the slower operating mode is selected, coupling a bit line to a first portion of memory cells located in the first one of the plurality of rows and the one of the plurality of columns; and
    if the faster operating mode is selected, coupling the bit line to the first portion of memory cells and to a second portion of memory cells located in the second one of the plurality of rows and the one of the plurality of columns.

11. A method as in claim 9, wherein said step of selecting one of the slower operating mode and the faster operating mode comprises the steps of:
    programming at least one register bit.

12. A method as in claim 9, wherein said step of selecting one of the slower operating mode and the faster operating mode comprise the step of:
    receiving a control signal at an integrated circuit pin.

13. A method as in claim 9, further comprising the steps of:
    receiving an input information value; and
    comparing the stored information value to the input information value.

14. A method as in claim 13, further comprising the step of:
    providing a hit signal in response to said step of comparing the stored information value to the input information value, the hit signal being asserted if the stored information value matches the input information value.

15. A method as in claim 13, further comprising the step of:
    determining if a cache hit has occurred.

16. A method as in claim 15, wherein the memory is a cache tag memory, the comprising the step of:
    providing a plurality of control signals to a cache memory array if the cache hit has occurred.

17. A method for operating a static random access (SRAM) memory in a cache controller, the memory having a plurality of memory cells arranged in a plurality of rows and a plurality of columns, the method comprising the steps of:

selecting one of a slower operating mode and a faster operating mode, the slower operating mode having a first memory access time and the faster operating mode having a second memory access time, the second memory access time having a shorter time duration than the first memory access time;

receiving an address from a processor;

if the slower operating mode is selected, selecting a first one of the plurality of rows and one of the plurality of columns corresponding to the address;

if the slower operating mode is selected, accessing the memory with the first memory access time to retrieve a stored information value;

if the faster operating mode is selected, selecting the first one of the plurality of rows, a second one of the plurality of rows, and the one of the plurality of columns corresponding to the address;

if the faster operating mode is selected, accessing the memory with a second memory access time to retrieve the stored information value;

comparing the stored information value to a first value received from the processor to determine if a cache hit has occurred; and     if the cache hit has occurred, providing a plurality of control signals to a cache.

18. A method as in claim 17, further comprising the step of:

writing the stored information value into multiple memory locations simultaneously.

19. A method as in claim 18, wherein said step of writing is performed during testing of the memory.

* * * * *